(12) United States Patent
Wei et al.

(10) Patent No.: US 9,468,091 B2
(45) Date of Patent: Oct. 11, 2016

(54) STRESS-REDUCED CIRCUIT BOARD AND METHOD FOR FORMING THE SAME

(71) Applicants: Chien-Cheng Wei, New Taipei (TW); Wu-Hui Cheng, New Taipei (TW)

(72) Inventors: Chien-Cheng Wei, New Taipei (TW); Wu-Hui Cheng, New Taipei (TW)

(73) Assignee: Tong Hsing Electronic Industries, Ltd., Taipei (TW)

( * ) Notice: Subject to any disclaimer, the term of this patent is extended or adjusted under 35 U.S.C. 154(b) by 183 days.

(21) Appl. No.: 13/960,897

(22) Filed: Aug. 7, 2013

(65) Prior Publication Data

US 2014/0110159 A1    Apr. 24, 2014

(30) Foreign Application Priority Data

Oct. 18, 2012   (TW) .............................. 101138461 A

(51) Int. Cl.
| | |
|---|---|
| H05K 1/02 | (2006.01) |
| H05K 3/06 | (2006.01) |
| H05K 3/00 | (2006.01) |
| H05K 1/03 | (2006.01) |
| H05K 3/10 | (2006.01) |
| H05K 3/14 | (2006.01) |
| H05K 3/16 | (2006.01) |
| H05K 3/38 | (2006.01) |

(52) U.S. Cl.
CPC .......... *H05K 1/0271* (2013.01); *H05K 1/0265* (2013.01); *H05K 1/0306* (2013.01); *H05K 3/06* (2013.01); *H05K 3/108* (2013.01); *H05K 3/146* (2013.01); *H05K 3/16* (2013.01); *H05K 3/388* (2013.01); *H05K 2201/0338* (2013.01); *H05K 2201/09845* (2013.01); *H05K 2203/058* (2013.01); *H05K 2203/1476* (2013.01); *H05K 2203/1572* (2013.01)

(58) Field of Classification Search
USPC ....... 174/254, 255, 256, 257, 258, 259, 260, 174/261, 262, 126.1
See application file for complete search history.

(56) References Cited

U.S. PATENT DOCUMENTS

| | | | |
|---|---|---|---|
| 6,387,731 B1 * | 5/2002 | Wensel ................. | H01L 21/565 257/737 |
| 8,067,696 B2 * | 11/2011 | Tsai ..................... | H05K 1/0271 174/254 |
| 2006/0000638 A1 * | 1/2006 | Levine .................. | H01L 21/485 174/260 |
| 2006/0071345 A1 * | 4/2006 | Chiu .................... | H01L 25/0657 257/777 |
| 2009/0302485 A1 * | 12/2009 | Fan ........................ | H01L 23/13 257/780 |
| 2010/0038116 A1 * | 2/2010 | Tsai ..................... | H05K 1/0271 174/254 |
| 2010/0327421 A1 * | 12/2010 | Luan ...................... | H01L 23/13 257/687 |

FOREIGN PATENT DOCUMENTS

TW          I358251 B     2/2012

* cited by examiner

*Primary Examiner* — Timothy Thompson
*Assistant Examiner* — Michael F McCallister
(74) *Attorney, Agent, or Firm* — Blank Rome LLP

(57) ABSTRACT

A stress-reduced circuit board includes an insulating substrate, and first and second electrically conductive layers which are stacked one upon the other, and which respectively have peripheral marginal regions that are configured in a stepped arrangement. The first electrically conductive layer is configured to have an area dimension larger than that of the second electrically conductive layer and a thickness not greater than that of the second electrically conductive layer so as to minimize stress caused by a difference in coefficients of thermal expansion between the insulating substrate and the first and second electrically conductive layers.

4 Claims, 16 Drawing Sheets

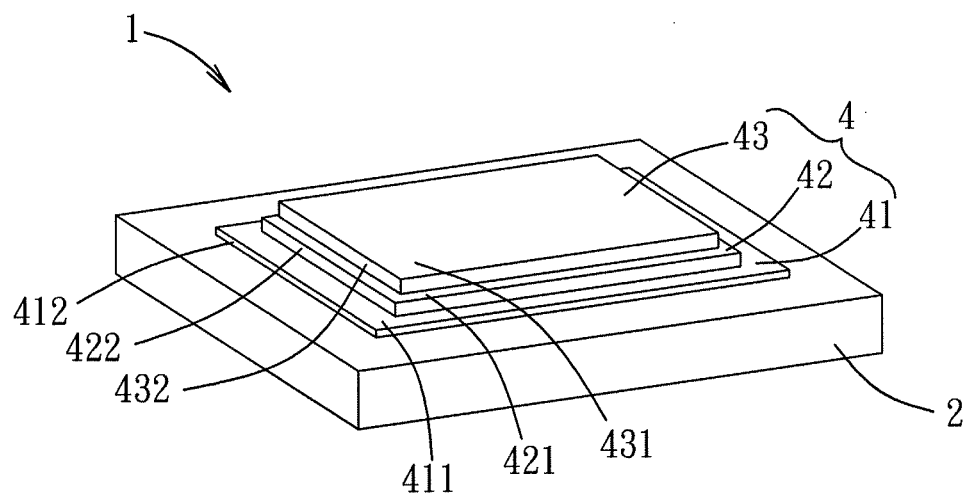
F I G. 2

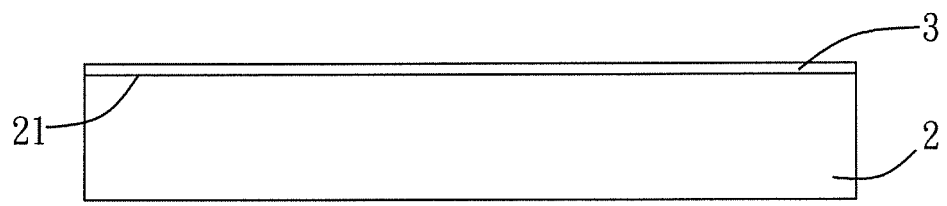
F I G. 5
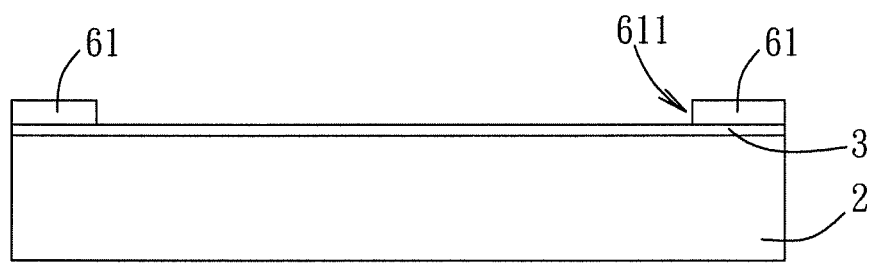
F I G. 6
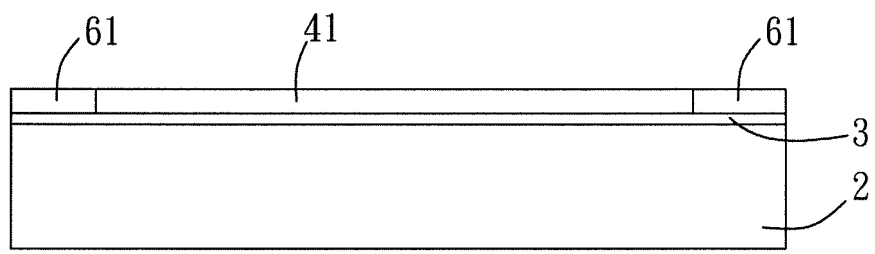
F I G. 7

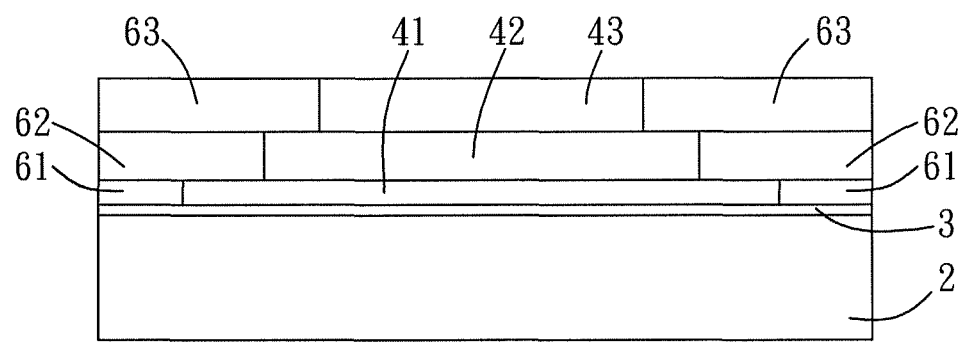
F I G. 11
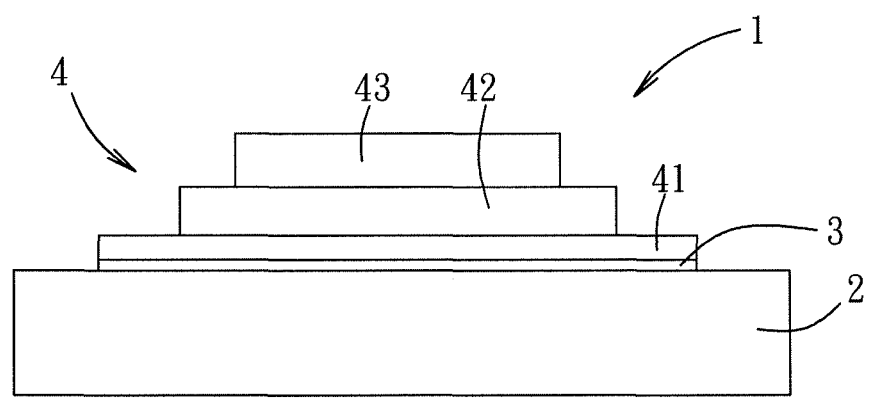
F I G. 12

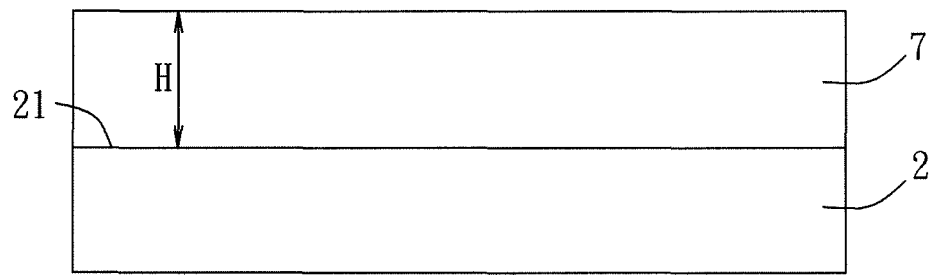
F I G. 14
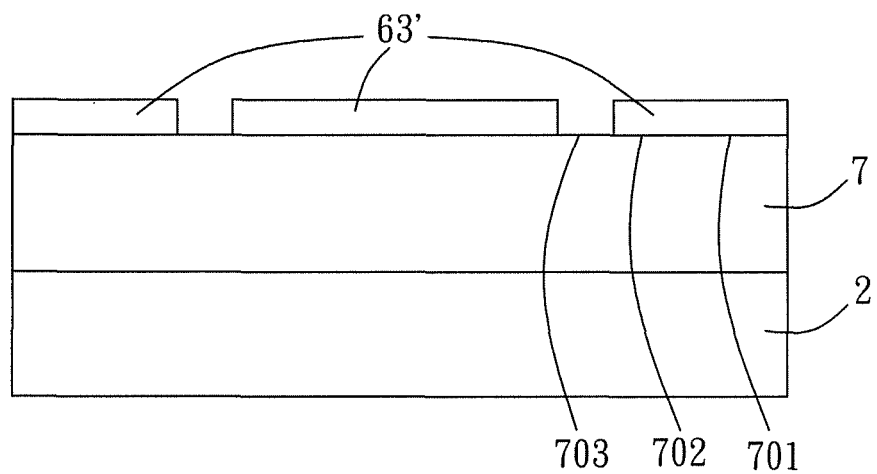
F I G. 15

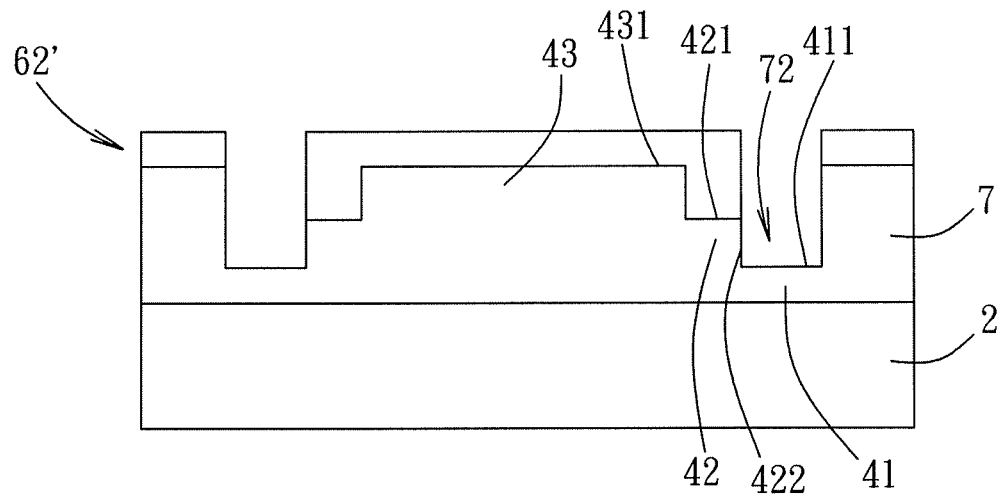
F I G. 18
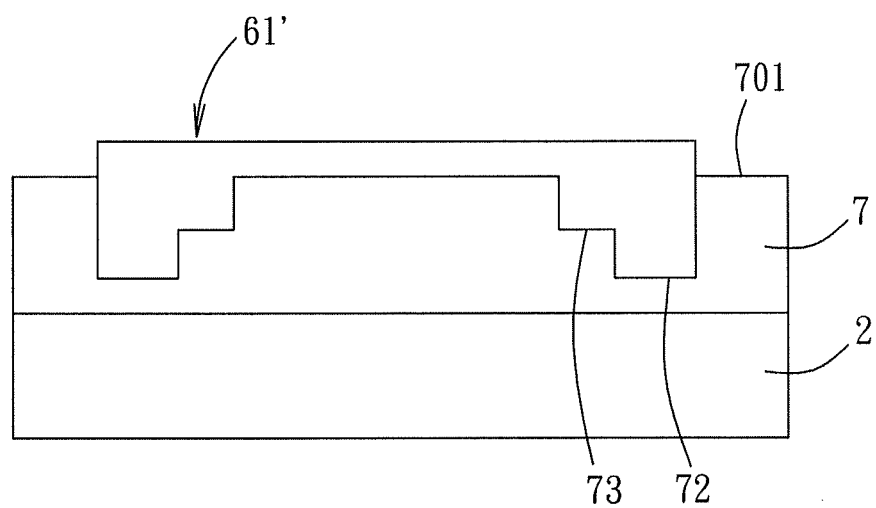
F I G. 19

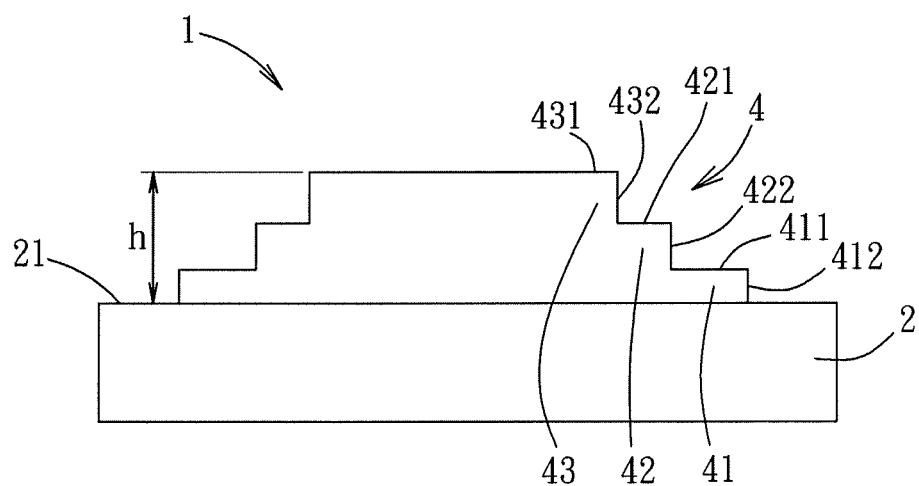
F I G. 20
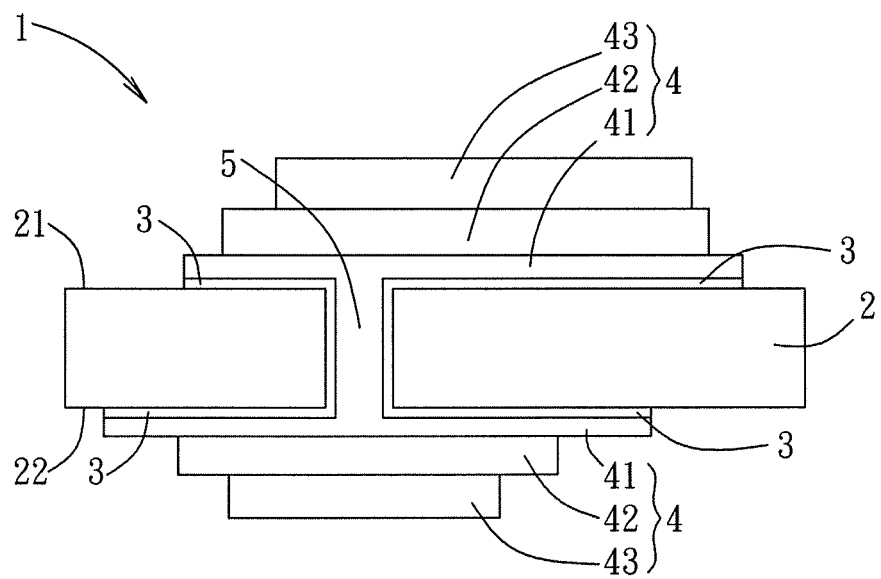
F I G. 21

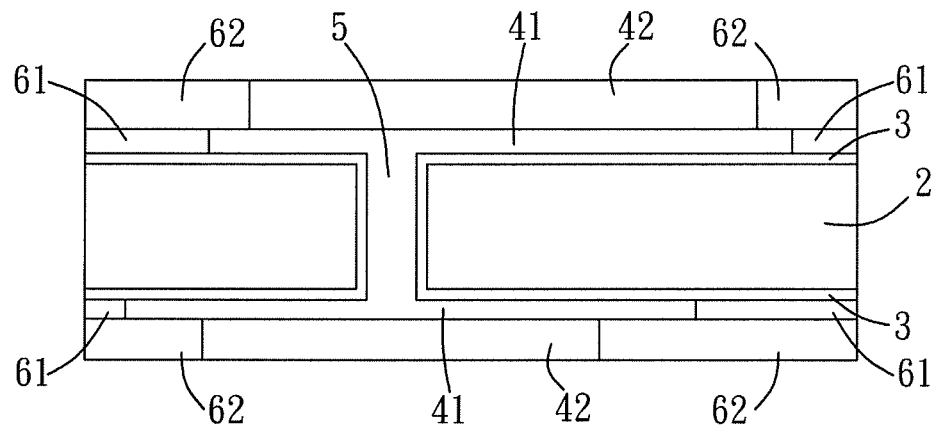
F I G. 27
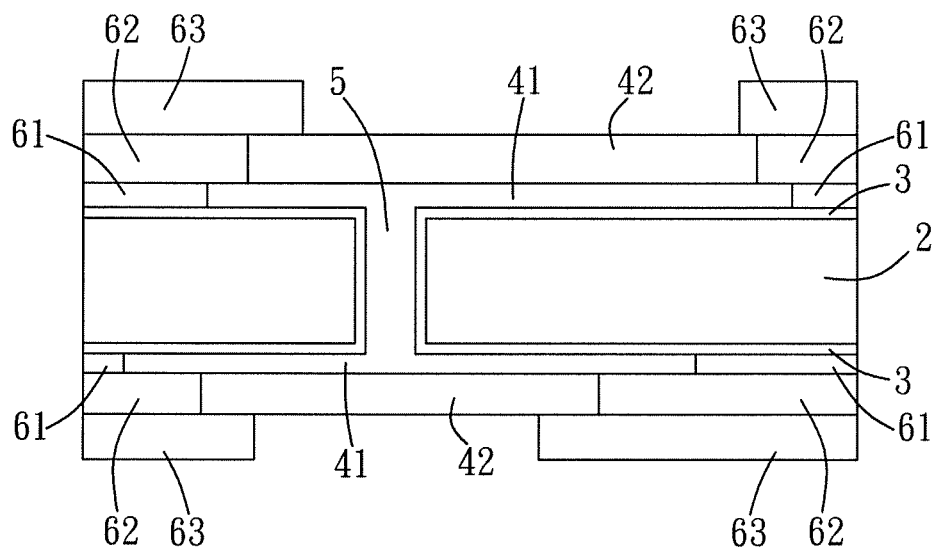
F I G. 28

STRESS-REDUCED CIRCUIT BOARD AND METHOD FOR FORMING THE SAME

CROSS-REFERENCE TO RELATED APPLICATION

This application claims priority of Taiwanese application no. 101138461, filed on Oct. 18, 2012.

BACKGROUND OF THE INVENTION

1. Field of the Invention

This invention relates to a circuit board, more particularly to a stress-reduced circuit board and a method for forming the same.

2. Description of the Related Art

A ceramic substrate, which has a relatively high thermal conductivity, a relatively low coefficient of thermal expansion (CTE), and excellent properties of heat-resistance and chemical-resistance, is generally used in a direct bonded copper (DBC) substrate for high heat dissipation and high-efficiency electronic devices, such as insulated-gate bipolar transistors (IGBTs), thermal electrical coolers/generators (TECs/TEGs), light-emitting diodes (LEDs), etc. In general, such a DBC substrate is made by high-temperature eutectic-bonding a copper foil to a fired ceramic substrate, and patterning a copper layer of the DBC substrate through a photolithography process, thereby forming desired circuitry on the DBC substrate.

Due to the requirement for high-power electronic devices, the DBC substrate used in such high-power electronic devices is required to sustain very high voltage and current, and the copper layer used for making the DBC substrate should have a relatively large thickness. Typically, the thickness is around 100 um~300 um. However, since there is a serious "CTE mismatch" between a ceramic material ($Al_2O_3$: 6.9 mm/m° C.) and a copper material (16.4 mm/m° C.), and since the circuits are made from a relatively thick copper layer, after a period of use of the high-power electronic device, undesirable cracking and warpage of the ceramic substrate, and delamination of the circuits from the ceramic substrate may result.

In order to overcome the above problem, a circuit board 9 shown in FIG. 1 has been proposed. The circuit board 9 includes a ceramic substrate 91 and a plurality of copper circuits 92. Each of the copper circuits 92 has a sloping peripheral region 921 such that a marginal edge of each of the copper circuits 92 has a smallest thickness, thereby preventing delamination between the ceramic substrate 91 and copper circuits 92. However, as the copper circuits 92 are formed by etching a copper layer (not shown) on the ceramic substrate 91, the sloping peripheral regions 921 can be formed only if the parameters for etching the copper layer are precisely controlled. Thus, it is very hard to mass produce the circuit board 9 having consistent sloping peripheral regions 921 with a desired slope as shown in FIG. 1.

US patent application publication no. 2009/0101392 A1 discloses a circuit board including an insulating-ceramic substrate, a metal circuit plate bonded to one face of the insulating-ceramic substrate, and a metal heat sink bonded to another face of the insulating-ceramic substrate. The circuit board satisfies an equation of $(t_1^2-t_2^2)t_c^2/K<1.5$, where $t_1$ is a thickness of the metal circuit plate, $t_2$ is a thickness of the metal heat sink, $t_c$ is a thickness of the insulating-ceramic substrate, and K is an internal fracture toughness value of the insulating-ceramic substrate.

U.S. Pat. No. 5,561,321 discloses a composite substrate constituted by an alumina substrate, a metallic layer, and a copper sheet bonded to the alumina substrate via the metallic layer. The metallic layer is constituted by a tungsten sub-layer having a low coefficient of thermal expansion, a tungsten/silver-copper alloy having a medium coefficient of thermal expansion, and a silver-copper alloy sub-layer having a high coefficient of thermal expansion.

Taiwanese patent publication no. 200950629 discloses a metal/ceramic composite substrate including a thermo-conducting copper plate, a circuit-forming copper plate, a ceramic plate, a first buffer layer, and a second buffer layer. The ceramic plate is disposed between the thermo-conducting copper plate and the circuit-forming copper plate. The first buffer layer bonds the ceramic plate and the thermo-conducting copper plate, and the second buffer layer bonds the ceramic plate and the circuit-forming copper plate.

However, the aforesaid conventional composite substrates/circuit boards are disadvantageous in that the materials for making the same may not be readily accessible and the manufacturing process involved is complicated. In addition, they are likely to suffer delamination, cracking and warpage in response to temperature variation due to heterojunctions between multiple layers thereof.

SUMMARY OF THE INVENTION

Therefore, an object of the present invention is to provide a circuit board which is less likely to suffer delamination, cracking and warpage in response to temperature variation, and which can be produced on a mass scale for use in high-power electronic devices, and to provide a method for forming the circuit board.

According to a first aspect of this invention, a circuit board includes: an insulating substrate; and an electrically conductive unit including a first electrically conductive layer formed on the insulating substrate, and a second electrically conductive layer stacked on the first electrically conductive layer, the first and second electrically conductive layers respectively having peripheral marginal regions which are configured in a stepped arrangement such that the first electrically conductive layer is configured to have an area dimension larger than that of the second electrically conductive layer, and a thickness not greater than that of the second electrically conductive layer, so as to minimize stress caused by a difference in coefficients of thermal expansion between the electrically conductive unit and the insulating substrate.

According to a second aspect of this invention, a method for forming a stress-reduced circuit board includes the steps of:

(A) forming a first electrically conductive layer on an insulating substrate;

(B) forming a second photoresist layer to cover the first electrically conductive layer;

(C) patterning the second photoresist layer to form a second cavity which extends from an upper surface of the second photoresist layer to terminate at and expose a first central area of the first electrically conductive layer;

(D) electroplating a second electrically conductive layer on the first central area of the first electrically conductive layer to fill the second cavity so as to permit an upper surface of the second electrically conductive layer to be substantially flush with the upper surface of the second photoresist layer, such that a peripheral marginal region of the first electrically conductive layer and a peripheral marginal region of the second electrically conductive layer are in a stepped relationship, and such that the first electrically conductive layer has an area dimension larger than that of the second electrically conductive layer, and a thickness not greater than that of the second electrically conductive layer; and (E) removing the second photoresist layer.

According to a third aspect of this invention, a method for forming a circuit board that includes an insulating substrate and an electrically conductive unit which has a first electrically conductive layer formed on the insulating substrate, and a second electrically conductive layer stacked on the first electrically conductive layer, and which is configured to have a predetermined height, the method including the steps of:

(a) providing an electrically conductor plate that is bonded to the insulating substrate, and that has a height substantially equal to the predetermined height;

(b) forming a second photoresist layer on an upper surface of the electrically conductor plate;

(c) patterning the second photoresist layer to expose a second predetermined looped region of the upper surface of the electrically conductor plate;

(d) etching the second predetermined looped region to define a marginal edge of a peripheral marginal region of the second electrically conductive layer, and to expose a peripheral marginal region of the first electrically conductive layer;

(e) removing the second photoresist layer;

(f) forming a first photoresist layer on the upper surface of the electrically conductor plate;

(g) patterning the first photoresist layer to expose a first predetermined looped region of the upper surface of the electrically conductor plate, the first predetermined looped region surrounding the second predetermined looped region;

(h) etching the first predetermined looped region to define a marginal edge of the peripheral marginal region of the first electrically conductive layer, and to expose the insulating substrate, such that the peripheral marginal regions of the first and second electrically conductive layers are in a stepped relationship, and such that the first electrically conductive layer has an area dimension larger than that of the second electrically conductive layer, and a thickness not greater than that of the second electrically conductive layer; and (i) removing the first photoresist layer.

BRIEF DESCRIPTION OF THE DRAWINGS

Other features and advantages of the present invention will become apparent in the following detailed description of the preferred embodiments of the invention, with reference to the accompanying drawings, in which:

FIG. 2 is a perspective view of a first preferred embodiment of a circuit board according to this invention;

FIGS. 5 to 12 illustrate consecutive steps of the method of FIG. 4;

FIGS. 14 to 20 illustrate consecutive steps of the method of FIG. 13;

FIG. 21 is a perspective view of a second preferred embodiment of a circuit board according to this invention;

FIGS. 22 to 30 illustrate consecutive steps of forming the circuit board shown in FIG. 21.

DETAILED DESCRIPTION OF THE PREFERRED EMBODIMENTS

Figure 1:
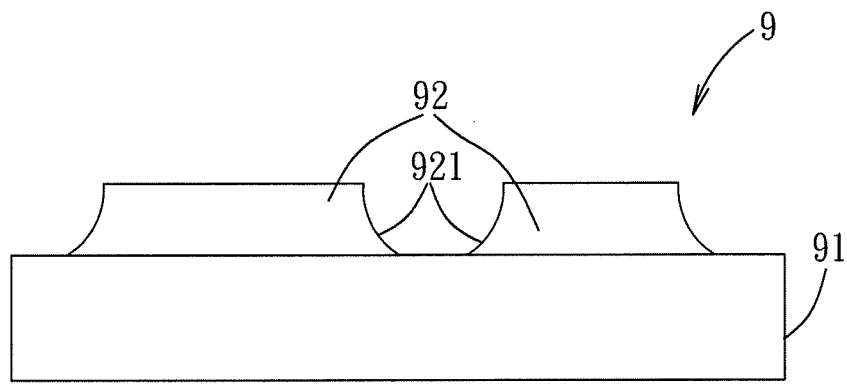
FIG. 1 shows a conventional circuit board in which each of copper circuits has a sloping peripheral region.

Before the present invention is described in greater detail, it should be noted herein that like elements are denoted by the same reference numerals throughout the disclosure.

Figure 3:
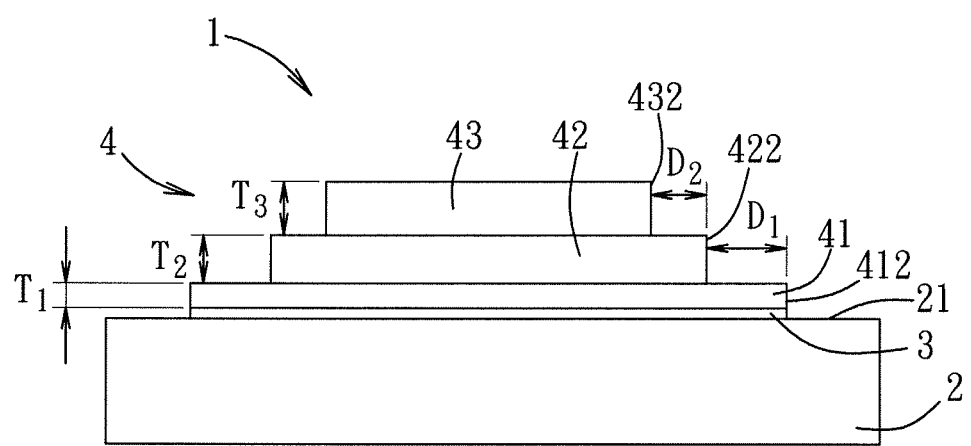
FIG. 3 is a side view of the circuit board of FIG. 2.

Referring to FIGS. 2 and 3, a first preferred embodiment of a circuit board 1 according to this invention is shown to include an insulating substrate 2, a seed layer 3, and an electrically conductive unit 4, and is suitable for use as a circuit board of an electronic device, especially a high-power electronic device. The insulating substrate 2 can be made from any insulating material, and preferably from a ceramic material, such as aluminum oxide, aluminum nitride, silicon nitride, zirconium oxide, beryllium oxide, etc.

The seed layer 3 is formed on an upper surface 21 of the insulating substrate 2 for facilitating formation of the electrically conductive unit 4.

The electrically conductive unit 4 includes a plurality of electrically conductive layers. In this embodiment, the electrically conductive unit 4 includes first, second and third electrically conductive layers 41, 42, 43 which are disposed on the insulating substrate 2, which are stacked one upon another, and which are preferably made from a copper material. The first, second and third electrically conductive layers 41, 42, 43 respectively have first, second and third peripheral marginal regions 411, 421, 431 which are configured in a stepped arrangement. The first electrically conductive layer 41 is configured to have a largest area dimension and a thickness not greater than that of the second electrically conductive layer 42 so as to minimize stress caused by a difference in coefficients of thermal expansion between the electrically conductive unit 4 and the insulating substrate 2. In the preferred embodiment, the first electrically conductive layer 41 is configured to have a smallest thickness.

The first, second and third peripheral marginal regions 411, 421, 431 respectively have first, second and third marginal edges 412, 422, 432. A distance (D1 or D2) between two adjacent ones of the marginal edges 412, 422, 432 ranges from 1 μm to 1 cm, and preferably from 10 μm to 500 μm. A thickness (T1, T2 or T3) of each of the first, second and third electrically conductive layers 41, 42, 43 ranges from 1 μm to 500 μm, and preferably from 10 μm to 150 μm.

In this embodiment, the thickness (T1) of the first electrically conductive layer 41 is 40 μm, the thickness (T2) of the second electrically conductive layer 42 is 75 μm, and the thickness (T3) of the third electrically conductive layer 43 is 85 μm. The distance (D1) between the first and second marginal edges 412, 422 is 200 μm, and the distance (D2) between the second and third marginal edges 422, 432 is 50 μm. The thicknesses (T1 to T3) and the distances (D1 and D2) as disclosed herein are for exemplification purposes, and the present invention should not be limited thereto.

In addition, although the electrically conductive unit 4 is a three-layer structure in this embodiment, it can be a two-layer structure or a multi-layer structure depending on requirements.

Figure 4:
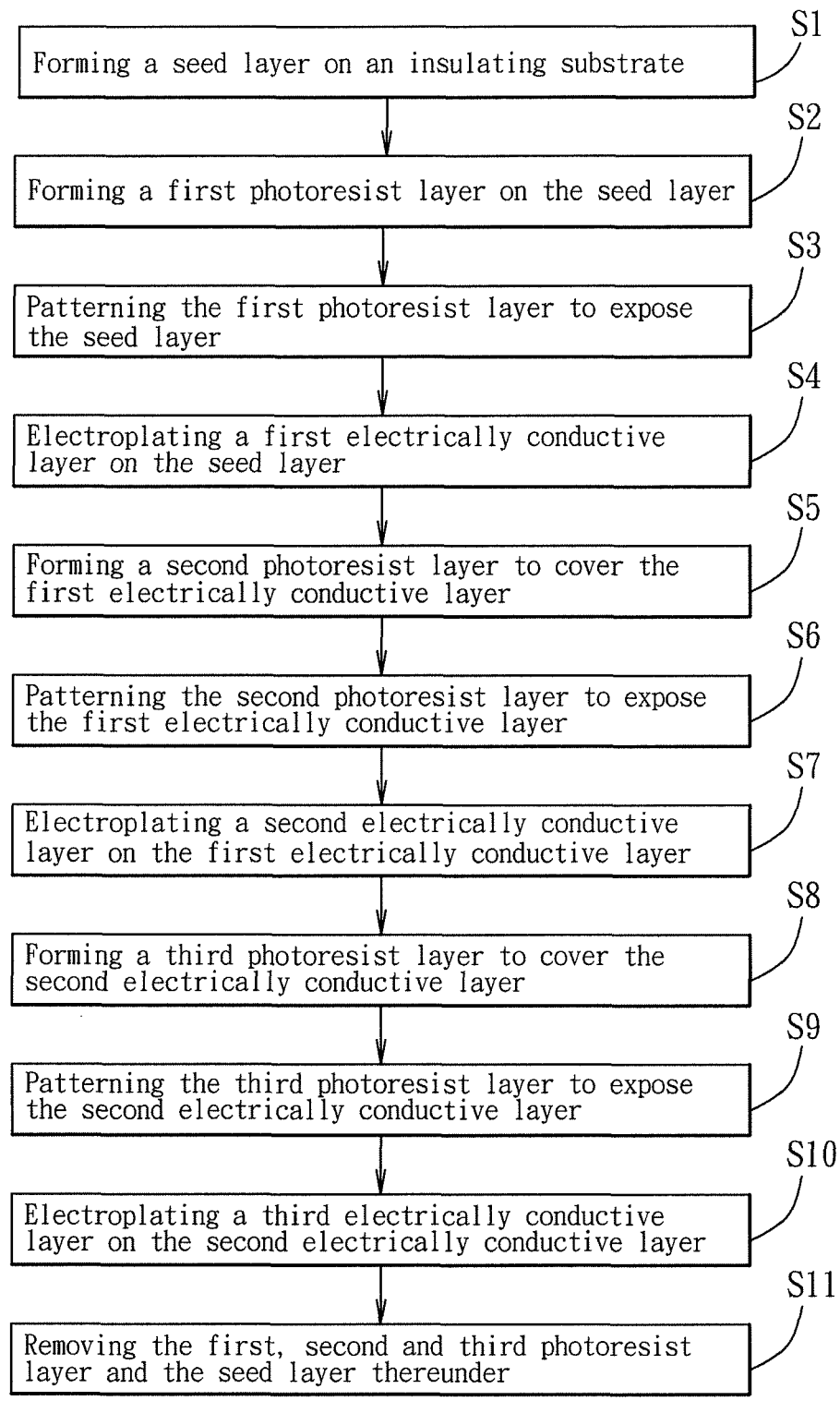
FIG. 4 is a flow chart illustrating a first embodiment of a method for forming the circuit board shown in FIGS. 2 and 3.

FIG. 4 illustrates the first embodiment of a method for forming the circuit board 1, which includes steps S1 to S11.

As shown in FIG. 5, in step S1, the seed layer 3 is formed on the upper surface 21 of the insulating substrate 2 by a metal deposition process, such as sputtering or evaporation so as to facilitate formation of the first electrically conductive layer 41 on the insulating substrate 2 (see also FIG. 7). Preferably, the seed layer 3 is formed by depositing an adhesion enhancing film (such as a film of titanium, chromium, or titanium/tungsten, etc.) on the upper surface 21 of the insulating substrate 2, followed by deposition of an electrically conductive film (such as a copper film) on the adhesion enhancing film. The adhesion enhancing film is a metal film for enhancing the deposition of the electrically conductive film, especially for enhancing the deposition of a copper film.

In step S2, a first photoresist layer 61 is formed on the seed layer 3. The first photoresist layer 61 is a photosensitive material layer, and has a thickness not smaller than that of the first electrically conductive layer 41. In this embodiment, the first photoresist layer 61 is a dry film photoresist.

In step S3, the first photoresist layer 61 is patterned using a photolithography process to form a first cavity 611. The first cavity 611 defines the shape and position of the first electrically conductive layer 41, and extends from an upper surface of the first photoresist layer 61 to terminate at and expose the seed layer 3 (see FIG. 6).

In step S4, the first electrically conductive layer 41 is electroplated on the seed layer 3 to fill the first cavity 611 such that an upper surface of the first electrically conductive layer 41 is substantially flush with the upper surface of the first photoresist layer 61 (see FIG. 7).

In step S5, a second photoresist layer 62 is formed to cover the first electrically conductive layer 41 and the first photoresist layer 61. The second photoresist layer 62 is a photosensitive material layer, and has a thickness not smaller than that of the second electrically conductive layer 42. In this embodiment, the second photoresist layer 62 is a dry film photoresist.

Figure 8:
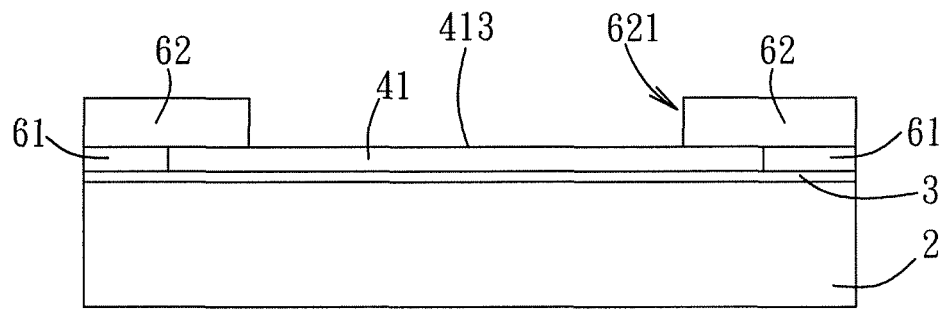
Figure 9:
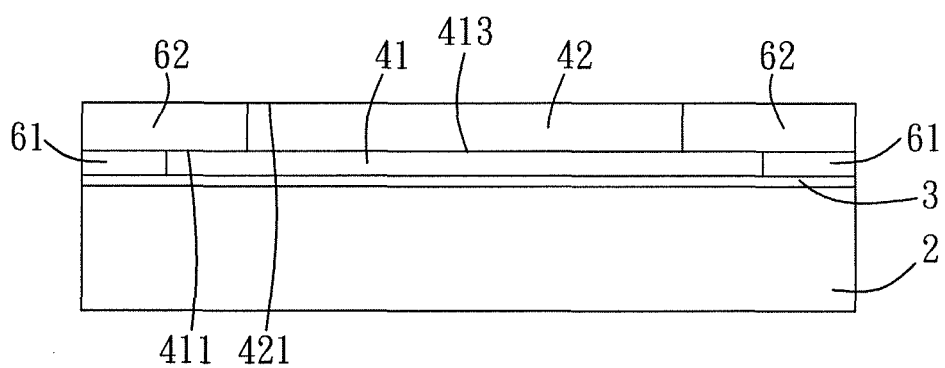

In step S6, the second photoresist layer 62 is patterned using a photolithography process to form a second cavity 621. The second cavity 621 defines the shape and position of the second electrically conductive layer 42, and extends from an upper surface of the second photoresist layer 62 to terminate at and expose a first central area 413 of the first electrically conductive layer 41 (see FIG. 8).

In step S7, the second electrically conductive layer 42 is electroplated on the first central area 413 of the first electrically conductive layer 41 to fill the second cavity 621 so as to permit an upper surface of the second electrically conductive layer 42 to be substantially flush with the upper surface of the second photoresist layer 62, such that the first peripheral marginal region 411 of the first electrically conductive layer 41 and the second peripheral marginal region 421 of the second electrically conductive layer 42 are in a stepped relationship, and such that the first electrically conductive layer 41 has an area dimension larger than that of the second electrically conductive layer 42, and a thickness not greater than that of the second electrically conductive layer 42.

In step S8, a third photoresist layer 63 is formed to cover the second electrically conductive layer 42 and the second photoresist layer 62. The third photoresist layer 63 is a photosensitive material layer, and has a thickness not smaller than that of the third electrically conductive layer 43. In this embodiment, the third photoresist layer 63 is a dry film photoresist.

Figure 10:
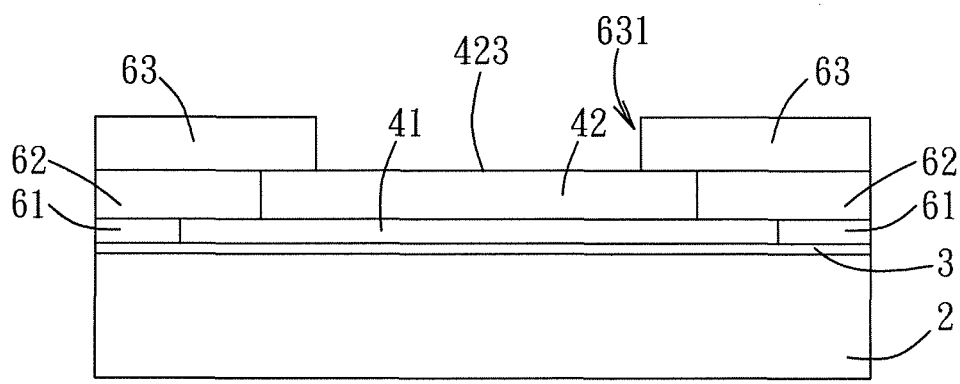

In step S9, the third photoresist layer 63 is patterned using a photolithography process to form a third cavity 631. The third cavity 631 defines the shape and position of the third electrically conductive layer 43, and extends from an upper surface of the third photoresist layer 63 to terminate at and expose a second central area 423 of the second electrically conductive layer 42 (see FIG. 10).

In step S10, the third electrically conductive layer 43 is electroplated on the second central area 423 of the second electrically conductive layer 42 to fill the third cavity 631 so as to permit an upper surface of the third electrically conductive layer 43 to be substantially flush with the upper surface of the third photoresist layer 63 such that the third peripheral marginal region 431 of the third electrically conductive layer 43 and the second peripheral marginal region 421 of the second electrically conductive layer 42 are in a stepped relationship, and such that the second electrically conductive layer 42 has an area dimension larger than that of the third electrically conductive layer 43, and a thickness not greater than that of the third electrically conductive layer 43.

In step S11, the third photoresist layer 63, the second photoresist layer 62, the first photoresist layer 61, and the seed layer 3 under the first photoresist layer 61 are removed in sequence.

The first, second and third electrically conductive layers 41, 42, 43 are electroplated to have a desired thickness by controlling the electroplating parameters (such as a current density, electroplating time, etc.).

It should be noted that although the first electrically conductive layer 41 is formed by electroplating in this embodiment, it can also be formed on the insulating substrate 2 without using the seed layer 3 and the first photoresist layer 61. In this case, steps S1 to S4 are omitted, and the first electrically conductive layer 41 is formed by eutectic-bonding metal foil to the insulating substrate 2, and patterning a metal layer on the insulating substrate 2 to form the first electrically conductive layer 41.

Figure 13:
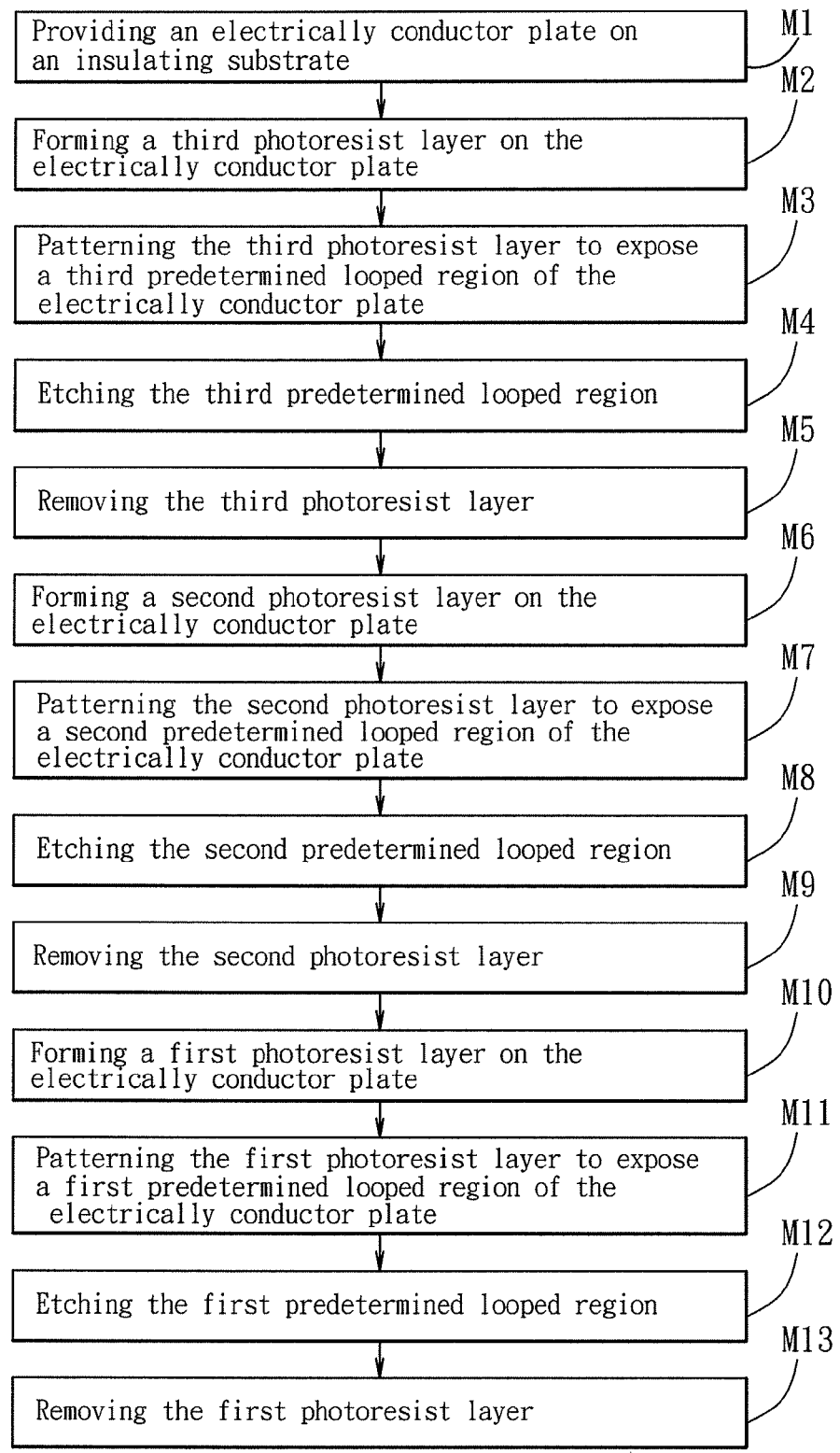
FIG. 13 is a flow chart illustrating a second embodiment of a method for forming a circuit board which is similar to the circuit board shown in FIGS. 2 and 3 and which is formed without using a seed layer.

FIG. 13 illustrates the second embodiment of a method for forming the circuit board 1, which includes steps M1 to M13. In this embodiment, the circuit board 1 is formed without using the seed layer 3, and the first to third electrically conductive layers 41, 42, 43 are stacked one upon another to have a predetermined height (h) (see FIG. 20).

In step M1, an electrically conductor plate 7 that is bonded to the insulating substrate 2 is provided. The electrically conductor plate 7 has a height (H) substantially equal to the predetermined height (h) (see FIGS. 14 and 20).

In step M2, a third photoresist layer 63' is formed on an upper surface of the electrically conductor plate 7. The third photoresist layer 63' can be a dry film photoresist or a liquid-type photoresist material.

In step M3, the third photoresist layer 63' is patterned using a photolithography process to expose a third predetermined looped region 703 of the upper surface of the electrically conductor plate 7 (see FIG. 15).

Figure 16:
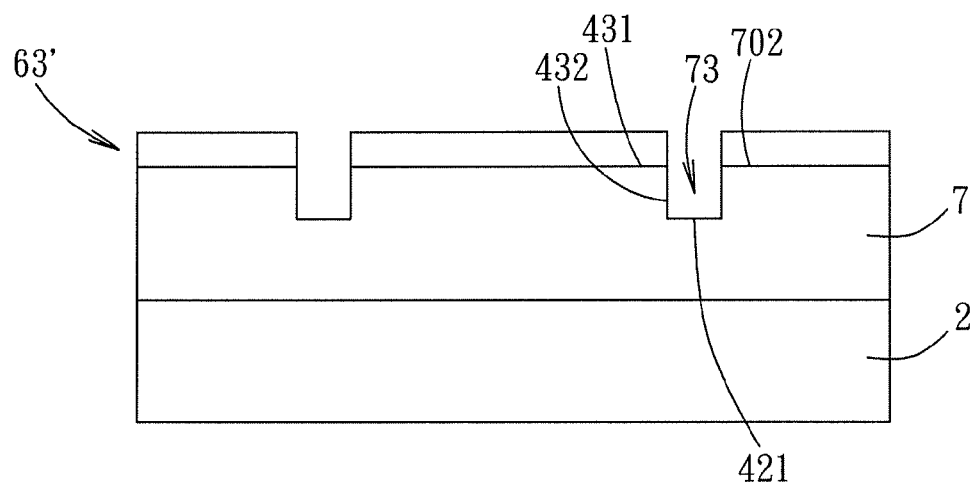

In step M4, the third predetermined looped region 703 is etched to a predetermined depth to define the third marginal edge 432 of the third peripheral marginal region 431 of the third electrically conductive layer 43, and to expose the second peripheral marginal region 421 of the second electrically conductive layer 42, thereby forming a third looped trench 73 (see FIGS. 16 and 20).

In step M5, the third photoresist layer 63' is removed using a photoresist stripping process.

In step M6, a second photoresist layer 62' is formed on the upper surface of the electrically conductor plate 7. In this embodiment, the second photoresist layer 62' is formed by applying a photoresist material onto the upper surface of the electrically conductor plate 7 so as to fill the third looped trench 73.

Figure 17:
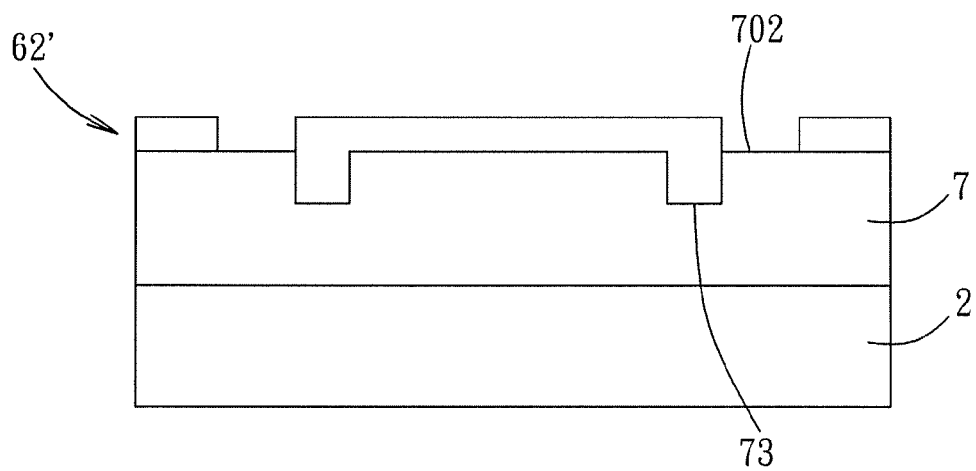

In step M7, the second photoresist layer 62' is patterned using a photolithography process to expose a second predetermined looped region 702 of the upper surface of the electrically conductor plate 7 that surrounds the third predetermined looped region 703 (i.e., the third looped trench 73) (see FIGS. 15 and 17).

In step M8, the second predetermined looped region 702 is etched to define the second marginal edge 422 of the second peripheral marginal region 421 of the second electrically conductive layer 42, and to expose the first peripheral marginal region 411 of the first electrically conductive layer 41 such that the third and second peripheral marginal regions 431, 421 are in a stepped relationship, and such that the second electrically conductive layer 42 has an area dimension larger than that of the third electrically conductive layer 43 and a thickness not greater than that of the third electrically conductive layer 43, thereby forming a second looped trench 72 (see FIGS. 18 and 20).

In step M9, the second photoresist layer 62' is removed using a photoresist stripping process.

In step M10, a first photoresist layer 61' is formed on the upper surface of the electrically conductor plate 7. In this embodiment, the first photoresist layer 61' is formed by applying a photoresist material onto the upper surface of the electrically conductor plate 7 so as to fill the second and third looped trenches 72, 73.

In step M11, the first photoresist layer 61' is patterned using a photolithography process to expose a first predetermined looped region 701 of the upper surface of the electrically conductor plate 7. The first predetermined looped region 701 surrounds the second predetermined looped region 702 (i.e., the second looped trench 72) (see FIGS. 15 and 19).

In step M12, the first predetermined looped region 701 is etched to define the first marginal edge 412 of the first peripheral marginal region 411 of the first electrically conductive layer 41, and to expose the upper surface 21 of insulating substrate 2, such that the second and first peripheral marginal regions 421, 411 are in a stepped relationship, and such that the first electrically conductive layer 41 has a largest area dimension and a thickness not greater than that of the second electrically conductive layer 42 (see FIG. 20).

In step M13, the first photoresist layer 61' is removed using a photoresist stripping process.

It should be noted that, according to the design of the circuits on the insulating substrate 2, steps M6 to M9 or steps M10 to M13 may be implemented before steps M2 to M5. Thus, the second embodiment of the method according to this invention should not be limited to the above sequence of steps.

By virtue of the aforesaid first or second embodiment of the method according to this invention, the circuit board 1 can be more easily mass produced in comparison with the conventional circuit board 9 shown in FIG. 1.

FIG. 21 shows a second preferred embodiment of a circuit board 1 according to this invention. The second preferred embodiment differs from the first preferred embodiment in that the circuit board 1 according to the second preferred embodiment includes two electrically conductive units 4 respectively formed on upper and lower surfaces 21, 22 of an insulating substrate 2, and that a conductor member 5 extends through the insulating substrate 2 and has two ends respectively and electrically connected to the two electrically conductive units 4. Each of the electrically conductive units 4 is substantially the same as that of the first preferred embodiment.

Figure 22:
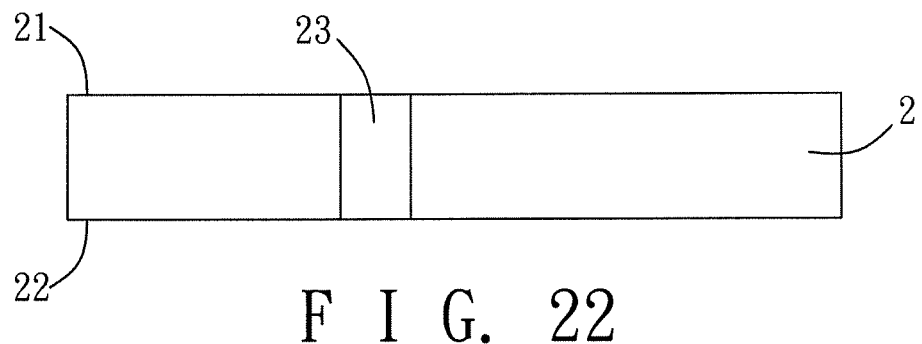
Figure 23:
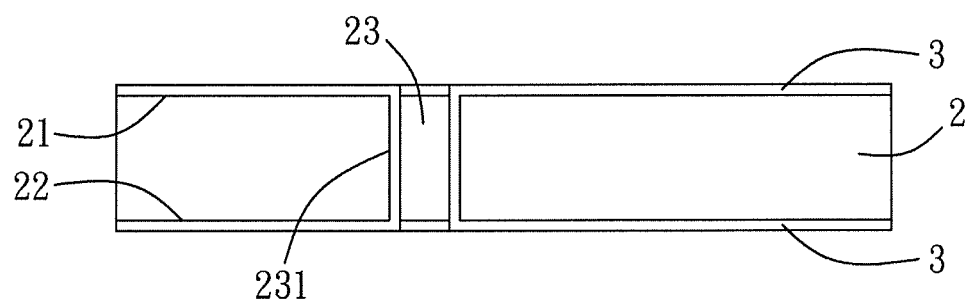
Figure 24:
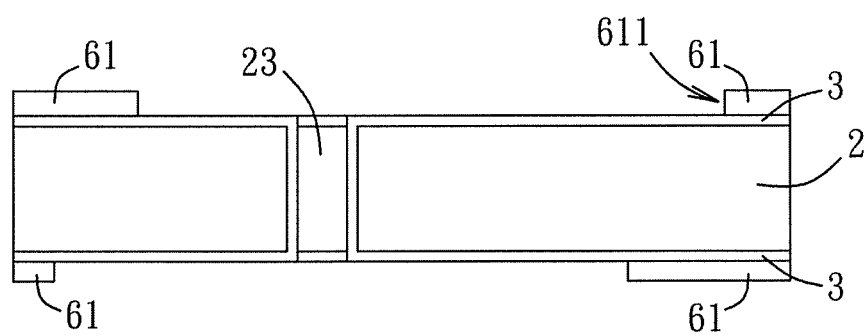
Figure 25:
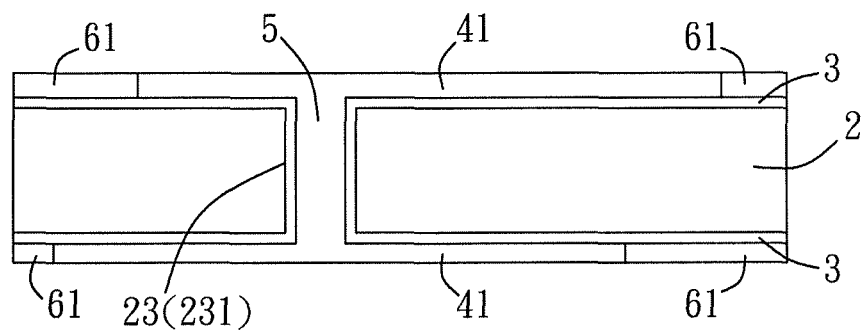
Figure 26:
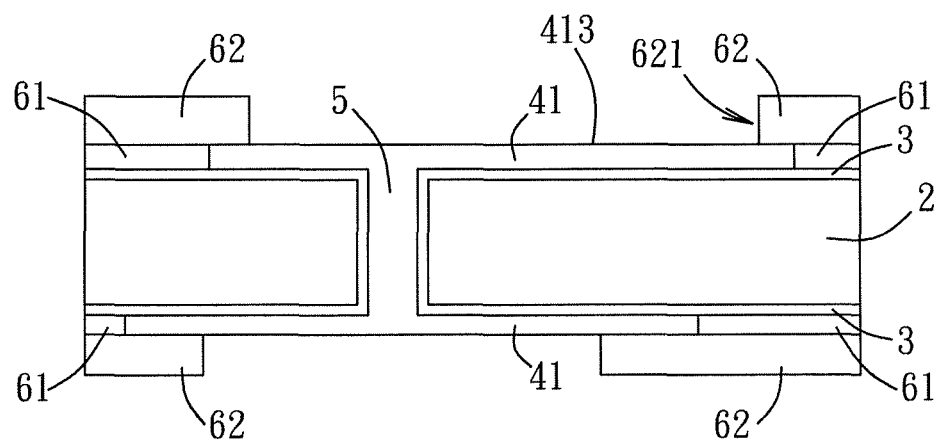
Figure 29:
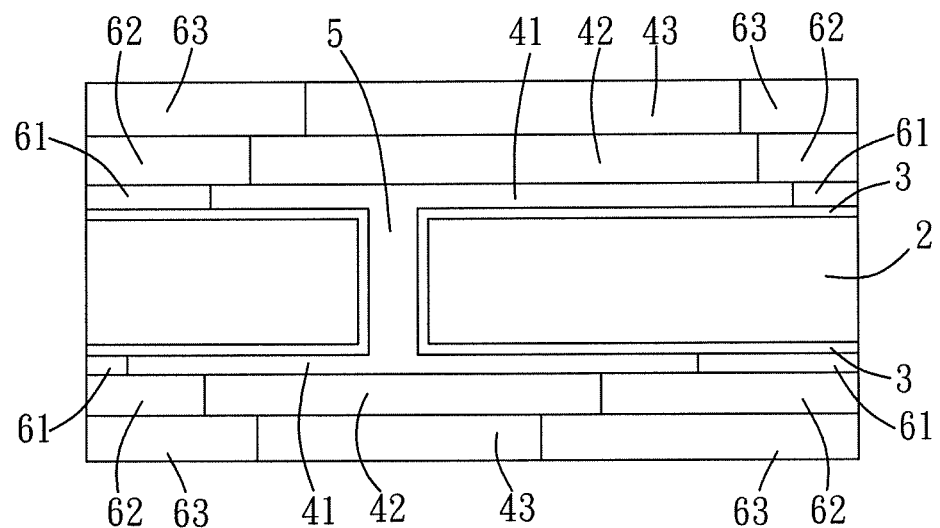
Figure 30:
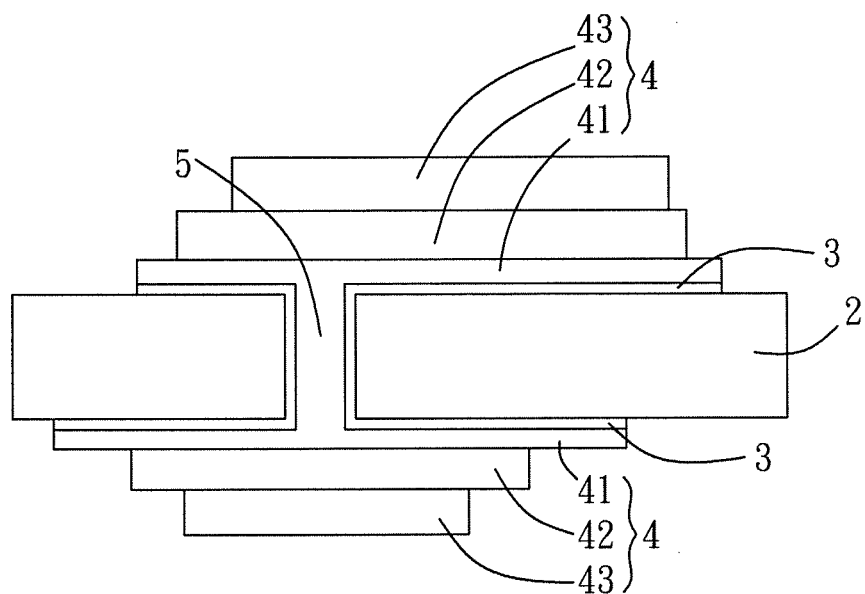

A method for forming the second preferred embodiment of the circuit board 1 is similar to the first embodiment of the method for forming the first preferred embodiment of the circuit board 1, except that a through hole 23 is formed in the insulating substrate 2 (see FIG. 22). The through hole 23 may be formed using a laser drilling process, a mechanical drilling process, or a mechanical punching process before forming a seed layer 3 on the insulating substrate 2 (see FIG. 23). Referring to FIGS. 23 to 25, the seed layer 3 is formed on each of the upper and lower surfaces 21, 22, and a through-hole defining wall surface 231. The seed layer 3 may be formed by a metal deposition process similar to that employed in step S1, or by any other well-known processes. Two first photoresist layers 61 are respectively formed on upper and lower sides of the insulating substrate 2 so as to cover the seed layer 3. The patterning of each of the first photoresist layers 61 is similar to that in step S3. Two first electrically conductive layers 41 are respectively electroplated on the upper and lower sides of the insulating substrate 2. The electroplating of each of the first electrically conductive layers 41 is similar to that in step S4, except that during forming of the first electrically conductive layers 41, the conductor member 5 is electroplated along the through-hole defining wall surface 231 so as to fill the through hole 23. The subsequent steps for forming each of the electrically conductive units 4 are substantially the same as steps S5 to S11 (see also FIGS. 26 to 30).

The present invention will now be explained in more detail below by way of the following examples and comparative examples.

EXAMPLE 1

Figure 31:
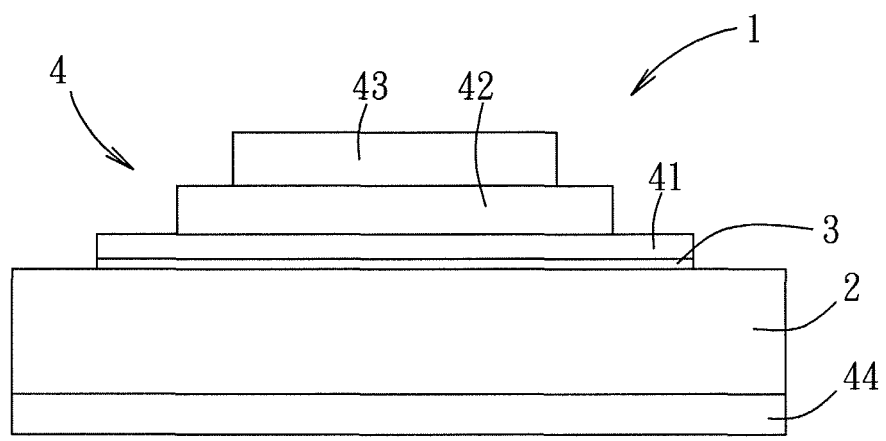
FIG. 31 illustrates a circuit board of Example 1 according to this invention.

A circuit board 1 of Example 1 was formed according to the first embodiment of the method for forming the circuit board 1 in the first preferred embodiment, and has a structure shown in FIG. 31. The circuit board 1 has the electrically conductive unit 4 on the upper side thereof, and a copper layer 44 which fully covers a lower surface of the insulating substrate 2, and which has a thickness of 80~90 μm. The electrically conductive unit 4 and the seed layer 3 together have a height of about 180 μm. The electrically conductive unit 4 was made from a copper material, and the insulating substrate 2 was made from a ceramic material.

COMPARATIVE EXAMPLE 1

A circuit board of Comparative Example 1 has a structure similar to that of Example 1 except that the electrically conductive unit thereof includes only a single electrically conductive layer (i.e., no stepped structure is formed), and that the copper layer on the lower surface of the insulating substrate has a thickness of about 80~90 μm, and the electrically conductive unit and the seed layer together have a height of about 180 μm.

Temperature Test

For the lower side of each of the circuit boards of Example 1 and Comparative Example 1, a plurality of shadow moiré fringe patterns were created at different temperatures (23° C., 68° C., 113° C., 158° C., 203° C., 243° C., and 258° C.). Each of the fringe patterns was analyzed for quantifying a warpage of the circuit boards. The results are shown in Table 1.

TABLE 1

| Temperature (° C.) | Example 1 | Comparative Example 1 |
|---|---|---|
| 23 | 75 μm | −110 μm |
| 68 | 84 μm | −38 μm |
| 113 | 76 μm | 72 μm |
| 158 | 67 μm | 144 μm |
| 203 | 68 μm | 202 μm |
| 243 | 73 μm | 203 μm |
| 258 | 70 μm | 182 μm |

From the results shown in Table 1, it can be found that over a temperature range from 23° C. to 258° C., the maximum difference value of warpage for Example 1 is only 17 μm, and the maximum difference value of warpage for Comparative Example 1 is 313 μm. Thus, it is apparent that the circuit board of Example 1 is less sensitive to variation in temperature.

Reflow Test

Ten samples of the circuit boards of Example 1 and ten samples of the circuit boards of Comparative Example 1 were prepared. Each circuit board sample was passed through a reflow oven three times. The reflow oven was controlled at 260° C.

After the re flow test, no delamination or micro-crack was found in the circuit board samples of Example 1. The average warpage of the tested circuit board samples of Example 1 was around 60 μm. Among the ten circuit board samples of Comparative Example 1, 6 had defects of delamination, and 4 had defects of micro-crack. The average warpage of the tested circuit board samples of Comparative Example 1 was 250 μm.

Thermal Cyclic Test 40 samples of the circuit board of Example 1 and 40 samples of the circuit board of Comparative Example 1 were prepared. The thermal cyclic test involved subjecting the circuit board samples through temperature cycles (repeated for 30 minutes at −40° C. and for 30 minutes at 125° C.) for 1000 cycles.

After the thermal cyclic test, no delamination or other defects was found in the circuit board samples of Example 1. The average warpage of the tested circuit board samples of Example 1 was around 20 μm. However, delamination was observed in all of the circuit board samples of Comparative Example 1 after 127 cycles of the test.

From the above tests, it is apparent that the circuit board of the present invention, in which the peripheral marginal regions of the electrically conductive layers are configured in a stepped arrangement, has relatively good reliability compared with the conventional circuit board without a stepped structure.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A circuit board comprising:
an insulating substrate; and
an electrically conductive unit including a first electrically conductive layer formed on said insulating substrate, and a second electrically conductive layer stacked on said first electrically conductive layer, said first and second electrically conductive layers respectively having outer peripheral marginal regions which are configured in a stepped arrangement such that said first electrically conductive layer is configured to have an area dimension larger than that of said second electrically conductive layer, and a thickness not greater than that of said second electrically conductive layer, so as to minimize stress caused by a difference in coefficients of thermal expansion between said electrically conductive unit and said insulating substrate,
wherein said first and second electrically conductive layers are made from the same electrically conductive metal material.

2. The circuit board of claim 1, wherein said outer peripheral marginal regions respectively have marginal edges, a distance between two adjacent ones of said marginal edges ranging from 1 μm to 1 cm.

3. The circuit board of claim 2, wherein the distance ranges from 10 μm to 500 μm.

4. The circuit board of claim 1, wherein said insulating substrate is made from a ceramic material, and said electrically conductive layers are made from copper.

* * * * *